(12) United States Patent
Segalman et al.

(10) Patent No.: US 9,576,799 B2
(45) Date of Patent: Feb. 21, 2017

(54) DOPING OF A SUBSTRATE VIA A DOPANT CONTAINING POLYMER FILM

(71) Applicants: THE REGENTS OF THE UNIVERSITY OF CALIFORNIA, Oakland, CA (US); Rohm and Haas Electronic Materials LLC, Marlborough, MA (US); Dow Global Technologies LLC, Midland, MI (US)

(72) Inventors: Rachel A. Segalman, Pleasanton, CA (US); Peter Trefonas, III, Medway, MI (US); Bhooshan C. Popere, Berkeley, CA (US); Andrew T. Heitsch, Midland, MI (US)

(73) Assignees: DOW GLOBAL TECHNOLOGIES, LLC, Midland, MI (US); ROHM AND HAAS ELECTRONIC MATERIALS LLC, Marlborough, MA (US); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/699,434

(22) Filed: Apr. 29, 2015

(65) Prior Publication Data

US 2016/0035572 A1    Feb. 4, 2016

Related U.S. Application Data

(60) Provisional application No. 61/986,395, filed on Apr. 30, 2014.

(51) Int. Cl.
*H01L 21/225* (2006.01)
*H01L 21/02* (2006.01)
*H01L 21/22* (2006.01)

(52) U.S. Cl.
CPC ..... *H01L 21/2254* (2013.01); *H01L 21/02118* (2013.01); *H01L 21/2225* (2013.01)

(58) Field of Classification Search
CPC ............ H01L 21/2254; H01L 21/02118; H01L 21/2225
See application file for complete search history.

(56) References Cited

U.S. PATENT DOCUMENTS 4,578,283 A    3/1986  Kirtley et al.
4,619,719 A    10/1986 Thomas et al.
(Continued)

FOREIGN PATENT DOCUMENTS

EP    0104412 A1    4/1984
EP    0165507 A2    12/1985
(Continued)

OTHER PUBLICATIONS

Ang., K.-W. et al. "300mm FinFET Results Utilizing Conformal, Damage Free, Ultra Shallow Junctions (Xj~5nm) Formed with Molecular Monolayer Doping Technique" Electron Devices Meeting (IEDM), 2011 IEEE International, Dec. 2011 (4 Pages) 35.5.1-35.5.4.
(Continued)

*Primary Examiner* — Long Pham
(74) *Attorney, Agent, or Firm* — Cantor Colburn LLP

(57) ABSTRACT

Disclosed herein is a method for doping a substrate, comprising disposing a coating of a composition comprising a copolymer, a dopant precursor and a solvent on a substrate; where the copolymer is capable of phase segregating and embedding the dopant precursor while in solution; and annealing the substrate at a temperature of 750 to 1300° C. for 0.1 second to 24 hours to diffuse the dopant into the substrate. Disclosed herein too is a semiconductor substrate comprising embedded dopant domains of diameter 3 to 30
(Continued)

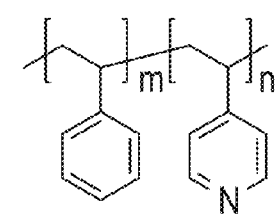

Polystyrene-block-Poly(4-vinylpyridine)
PS-b-P4VP

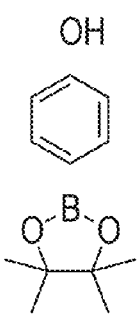

4-hydroxyphenyl
boronic acid pinacol ester nanometers; where the domains comprise Group 13 or Group 15 atoms, wherein the embedded spherical domains are located within 30 nanometers of the substrate surface.

9 Claims, 15 Drawing Sheets

(56) References Cited

U.S. PATENT DOCUMENTS

| | | | |
|---|---|---|---|
| 4,663,414 | A | 5/1987 | Estes et al. |
| 5,270,248 | A * | 12/1993 | Rosenblum ............ C23C 26/02 |
| | | | 136/261 |
| 5,478,776 | A | 12/1995 | Luftman et al. |
| 6,695,903 | B1 | 2/2004 | Kubelbeck et al. |
| 7,767,520 | B2 | 8/2010 | Kamath et al. |
| 8,304,780 | B2 | 11/2012 | Kamath et al. |
| 8,354,333 | B2 | 1/2013 | Afzali-Ardakani et al. |
| 8,405,176 | B2 * | 3/2013 | Tsukigata ............ H01L 21/2225 |
| | | | 136/261 |
| 8,466,035 | B2 | 6/2013 | Pollard |
| 8,513,642 | B2 | 8/2013 | Afzali-Ardakani |
| 9,076,719 | B2 | 7/2015 | Segalman |
| 2009/0239363 | A1 | 9/2009 | Leung et al. |
| 2009/0240001 | A1 | 9/2009 | Regner |
| 2012/0018702 | A1 | 1/2012 | Javey et al. |
| 2013/0295754 | A1 | 11/2013 | Afzali-Ardakani |

FOREIGN PATENT DOCUMENTS

| | | |
|---|---|---|
| JP | 2005123431 A | 5/2005 |
| JP | 2013235942 A | 11/2013 |
| KR | 20110105514 A | 9/2011 |

OTHER PUBLICATIONS

Daniel Herr, "Directed block copolymer self-assembly for nanoelectronics fabrication", J. Mater. Res., vol. 26, No. 2, Jan. 28, 2011, pp. 122-139.

Hazut et al., "Contact Doping of Silicon Wafers and Nanostructures with Phosphine Oxide Monolayers", American Chemical Society, NANO vol. 6, No. 11, pp. 10311-10318, Oct. 22, 2012.

Ho et al., "Controlled nanoscale doping of semiconductors via molecular monolayers," nature materials, vol. 7, pp. 62-67, Jan. 2008.

Ho, et al. "Wafer-Scale, Sub-5 nm Junction Formation by Monolayer Doping and Conventional Spike Annealing"; Nano Letters, vol. 9, No. 2, pp. 725-730 (2009).

Hoarfrost, Megan L., et al. "Spin-On Organic Polymer Dopants for Silicon" J. Phys. Chem. Lett. 2013, 4, 3741-3746.

KR20110105514—Sep. 27, 2011—Machine Translation (11 pages).

* cited by examiner

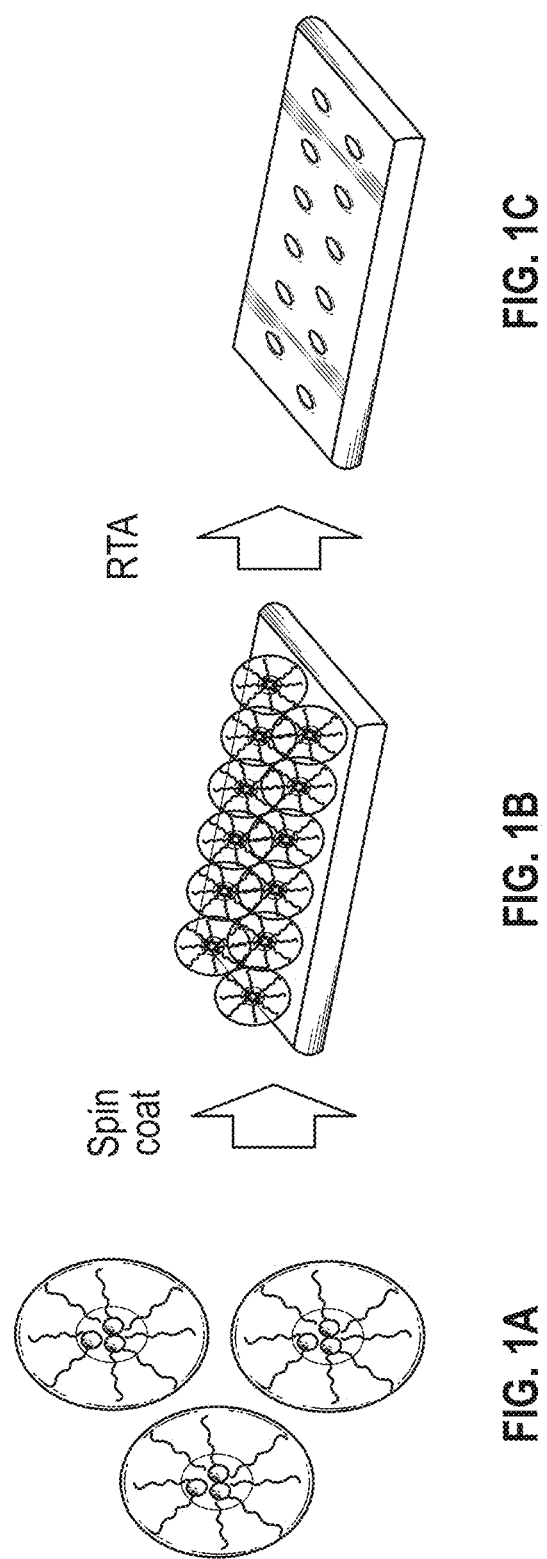

Polystyrene-block-Poly(4-vinylpyridine)
PS-b-P4VP 4-hydroxyphenyl
boronic acid pinacol ester Fluoroantimonic acid
hexaydrate

DOPING OF A SUBSTRATE VIA A DOPANT CONTAINING POLYMER FILM

CROSS REFERENCE TO RELATED APPLICATION

This U.S. non-provisional application claims the benefit of U.S. provisional application Ser. No. 61/986,395, filed 30 Apr. 2014, the entire contents of which are hereby incorporated by reference.

BACKGROUND

This disclosure relates to the doping of a substrate via a dopant containing polymer film that is disposed upon the substrate.

One of the challenges of scaling electronic devices down to the nanometer regime (sizes less than 100 nanometers (nm)) is achieving controlled doping of semiconductor materials in the sub-10 nanometer size range. For example, with transistor gate lengths fast approaching sub-10 nm size range, highly conductive ultra-shallow junctions on the nanometer length scale are used to scale down transistor size to achieve faster transistor speeds and higher packing densities. Furthermore, a wide range of proposed miniaturized electronic applications incorporate nanowire building blocks or other non-planar conductive nanostructures that use doping.

Current methods are not suitable for doping to depths of less than 10 nm. Ion implantation involves the bombardment of silicon substrates with high-energy dopant ions that replace silicon atoms in the substrate lattice. However, the process also produces point defects and vacancies in the lattice, which interact with the dopants to broaden the junction profile, thereby limiting the formation of sub-10 nm doping profiles. Furthermore, ion implantation is incompatible with non-planar, nanostructured materials because the energetic ions have a significant probability of penetrating completely through the nanostructure without remaining in the lattice while causing significant crystal damage. On the other hand, conventional solid-source diffusion procedures lack control and uniformity when doping is to be conducted at depths of less than 10 nm.

Monolayer doping procedures overcome the difficulties of current technologies and achieve high-quality, sub-5 nm doping profiles with high areal uniformity. During this procedure, a highly uniform, covalently bonded monolayer of dopant-containing small molecules is formed on silicon surfaces. In a subsequent thermal annealing step, the dopant atoms are diffused into the silicon lattice. This approach has resulted in the demonstration of shallow junctions (e.g., between 5 and 10 nanometers from the surface) with low sheet resistivity for both p- and n-type doping, and is compatible with non-planar, restricted-dimension nanostructured substrates. However, the monolayer doping strategy uses a couple of steps that are cumbersome. Firstly, deposition of the dopant containing small molecules is carried out in an oxygen free atmosphere (i.e., in an inert atmosphere or in a reduced pressure oxygen free condition) to prevent oxidative contamination. In addition, a silicon oxide capping layer is evaporated on top of the surface-functionalized silicon substrate before the annealing step in order to achieve efficient diffusion of the dopant atoms into the silicon substrate. The evaporation of the capping layer requires high vacuum of approximately ~$10^{-6}$ Torr.

Japanese Pat. App. JP 2005-123431 discloses forming an n-type diffusion zone by coating a film of an acidic organic phosphoric acid ester polymers (degree of polymerization of 500 or lower) dissolved in a polar organic solvent or water or a mixture thereof on a substrate followed by heating for a period of time at a first temperature that is lower than the diffusion temperature of phosphorus, then heating for a period of time in an oxidizing atmosphere at a second temperature that is higher than the first temperature but lower than the diffusion temperature of phosphorus, followed by heating for a period of time, such as 10 hours, in a non-oxidizing atmosphere at a third temperature that is higher than the second temperature in order to diffuse phosphorus into the substrate. This is a complex approach, necessitating three different heating cycles, and switching atmospheres between cycles. Also, the use of such polar solvents is often incompatible with standard processes used in semiconductor manufacture, possibly leading to poor film coating. If such a film is coated incompletely on the substrate, then the substrate will likely have a non-uniform doping of phosphorus.

Accordingly, it is desirable to develop a process for doping a substrate in ambient conditions without using a high vacuum, oxide capping layer, or oxidizing step.

SUMMARY

Disclosed herein is a method for doping a substrate, comprising disposing a coating of a composition comprising a copolymer, a dopant precursor and a solvent on a substrate; where the copolymer is capable of phase segregating and embedding the dopant precursor while in solution; and annealing the substrate at a temperature of 750 to 1300° C. for 1 second to 24 hours to diffuse the dopant into the substrate.

Disclosed herein too is a semiconductor substrate comprising embedded dopant domains of diameter 3 to 30 nanometers; where the domains comprise Group 13 or Group 15 atoms, wherein the embedded spherical domains are located within 30 nanometers of the substrate surface.

BRIEF DESCRIPTION OF THE FIGURES

FIG. 1A depicts PS-b-P4VP aggregates in solution with encapsulated dopant precursors;

FIG. 1B depicts thin film of aggregates with encapsulated dopants on a Si substrate FIG. 1C depicts nanoconfined doped regions after rapid thermal annealing (RTA);

DETAILED DESCRIPTION

Figure 2A:
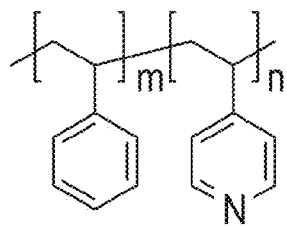
FIG. 2A shows the structure of the block copolymer polystyrene-b-poly(4-vinylpyridine)

The transition term "comprising" is inclusive of the transition terms "consisting of" and "consisting essentially of". The term "and/or" is used herein to mean both "and" as well as "or". For example, "A and/or B" is construed to mean A, B or A and B.

Disclosed herein is a method for achieving a doped semiconducting substrate by coating the substrate with a dopant containing polymer film and annealing the substrate at an elevated temperature. The polymer film comprises a copolymer that contains the dopant. The dopant is hydrogen bonded or ionically bonded to the copolymer. In an exemplary embodiment, the method disclosed herein uses a block copolymer self-assembly to confine dopant precursors (e.g., B, P, As, Sb, and the like) in nanoscale domains within polymer films.

The method comprises first encapsulating a dopant precursor inside a phase separated self-assembled block copolymer in solution. The solution contains the dopant precursor, the copolymer and the solvent. In one embodiment, the phase separated self-assembled block copolymer is in the form of spherical domains when in solution. Upon depositing thin films of these polymer solutions on to a substrate, periodic close-packed spherical aggregates self-assemble to define nanometer size regions of concentrated dopants. These areas of high concentration are located at regular intervals. Both the size of the dopant containing region and the spacing of the dopant on the substrate can be controlled via molecular design of the host polymer. After the film dries, dopant diffusion from the polymer film to the substrate occurs via rapid thermal annealing (RTA) resulting in locally doped regions of the substrate confined to a few nanometers in all three dimensions. Heating the substrate promotes diffusion of the dopant from the copolymer to the substrate.

This method is advantageous in that a vacuum is not desirable during the process. The polymer film acts as its own capping layer thereby eliminating the need for using a capping layer that is used in other commercially available comparative processes. In other words, the method is free of a step of forming an oxide capping layer over the polymer film prior to the annealing step. By using low annealing temperatures and low annealing times, spatially confined doped junctions as shallow as 5 nanometers in depth from the surface of the substrate and within a 20 nanometers square area can be obtained in the substrate. The method is particularly beneficial, for example, for forming highly conductive ultra-shallow junctions for transistor gates and source/drain and for doping silicon nanostructures such as nanowires to produce a variety of miniaturized electronic devices. The polymer film is also referred to herein as a polymer coating or a polymer layer.

The substrate is a semiconducting substrate. Examples of suitable semiconducting substrates are silicon, germanium, indium gallium arsenide, gallium arsenide, gallium phosphide, indium phosphide, indium nitride, indium arsenide, amorphous silicon, silicon germanium, silicon carbide, or the like, or a combination comprising at least one of the foregoing substrates. An exemplary semiconductor for use as the substrate is silicon.

The substrate is coated with a polymeric film that contains the dopant with which the substrate is doped. The dopants are Group 13 and Group 15 atoms. Dopants may include boron, phosphorus, arsenic, aluminum, bismuth, antimony, gallium, or combinations thereof. The dopant or dopant precursor is hydrogen bonded or ionically bonded to the polymer and will hereinafter be termed a dopant containing polymer.

The dopant precursors are capable of undergoing hydrogen bonding or ionic bonding with the copolymer when both are in solution. In one embodiment, the dopant precursor is not covalently bonded with the copolymer. In other words, the dopant precursor has a preference for bonding with the copolymer over the solvent. The dopant precursors may be small molecule (e.g., monomers, dimers, trimers, quadramers, or pentamers) or may be in polymeric form (e.g., having more than 5 repeat units). Examples of dopant precursors are boric acid, hexylboronic acid, phenylboronic acid, borane, vinylborane, vinyl boronic acids, borazine, vinylborazine, cyclodiborazane, boron quinolate, boron diketonate, pyrazabole, boron dipyrromethane, carborane, sodium tetraphenylborate, $AlX_3$ or $GaX_3$ or $AsX_3$ salts (where X is a halogen), aluminum sulfate, dimethylaluminum i-propoxide, phosphoric acid, pyrophosphoric acid, tetrapolyphosphoric acid, tetrametaphosphoric acid, diphenyl phosphate, dimethyl phosphate, (2-hydroxyphenyl)diphenylphosphine, (4-hydroxyphenyl)diphenylphosphine, 4-(diphenylphosphino)benzoic acid, 4-hydroxyphenyl boronic acid pinacol ester, fluoroantimonic acid hexahydrate, 3-(diphenylphosphino)propionic acid, tris(4-hydroxyphenyl)phosphine, [hydroxy(3-hydroxyphenyl)methyl]tris(hydroxymethyl)-phosphonium chloride, methyl(p -hydroxyphenyl)-diphenyl phosphonium iodide, 4,4,5,5-tetramethyl-1,3,2-dioxaphospholane 2-oxide, 5,5-dimethyl-1,3,2-dioxaphosphorinan-2-one, diethyl phosphite, phenylarsonic acid, dimethylarsinic acid, or the like, or a combination comprising at least one of the foregoing small molecules. Exemplary small molecule dopant precursors are 4-hydroxyphenyl boronic acid pinacol ester, fluoroantimonic acid hexahydrate, or a combination thereof.

Dopant precursors may also be in the form of polymers. Examples of polymeric dopant precursors are poly[2-(vinyl) pentaborane)], polyvinylborazine, polyborazylene, poly(cyclodiborazane), cyclodiborazane-containing polymers, boron quinolate polymers, pyrazabole containing polymers, carborane containing polymers, poly(vinylboronic acid), or the like, or a combination comprising at least one of the foregoing polymers. The polymers can be substituted if desired.

Phosphorus containing polymeric dopants include phosphazene polymers, phosphate polymers, phosphoric acid polymers, phosphonic acid polymers (e.g., poly(vinylidene-1,1-di-phosphonic acid), or the like, or a combination comprising at least one of the foregoing phosphorus containing polymeric dopants.

The phosphazene polymeric dopants have a —P=N— bond in the molecule. Phosphazene polymers may be cyclic polymers as represented by the formula (1) below, or linear polymers as represented by the formula (2) below; and a crosslinked phenoxyphosphazene compound obtained by crosslinking at least one species of phenoxyphosphazene selected from those represented by the formulae (1) and (2) below, with a crosslinking group represented by the formula (1) below:

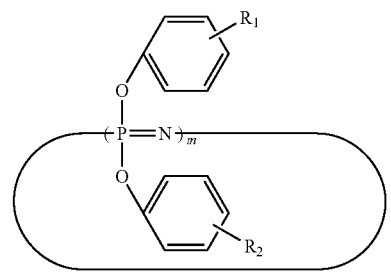

where in the formula (1), m represents an integer of 3 to 25, $R_1$ and $R_2$ are the same or different and are independently a hydrogen, a hydroxyl, a $C_{7-30}$ aryl group, a $C_{1-12}$ alkoxy, or a $C_{1-12}$ alkyl.

The chainlike phenoxyphosphazene represented by the formula (2) below:

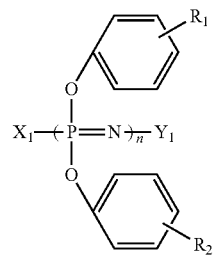

where in the formula (2), $X_1$ represents a —N=P(OPh)$_3$ group or a —N=P(O)OPh group, $Y_1$ represents a —P(OPh)$_4$ group or a —P(O) (OPh)$_2$ group, n represents an integer from 3 to 10000, Ph represents a phenyl group, $R_1$ and $R_2$ are the same or different and are independently a hydrogen, a halogen, a $C_{1-12}$ alkoxy, or a $C_{1-12}$ alkyl.

The phenoxyphosphazenes may also have a crosslinking group represented by the formula (3) below:

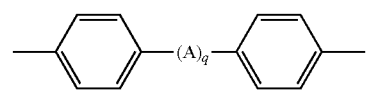

where in the formula (3), A represents —C(CH$_3$)$_2$—, —SO$_2$—, —S—, or —O—, and q is 0 or 1.

In an embodiment, phosphoric acid polymers have the structure of formula (4)

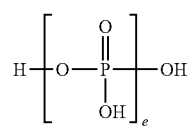

wherein e is an integer between 1 and 500.

It is desirable for the dopant containing polymer (the polymeric dopant precursor) to be free of nitrogen and silicon. When the dopant containing polymer is a homopolymer, it is preferred that it comprises as polymerized units a monomer that is free of hydroxyl, amine, amido, thiol, and carboxylic acid groups. When the dopant-containing polymer is a copolymer, it is preferred that it comprises as polymerized units <50 wt % of any monomers comprising a substituent chosen from hydroxyl, amine, amido, thiol, carboxylic acid, and combinations thereof. Organo-arsenic polymers may also be used.

An example of a phosphonic acid polymer is poly(vinylidene-1,1-di-phosphonic acid) or poly(diethyl vinylphosphonate). An exemplary phosphorus containing polymer is poly(diethyl vinylphosphonate).

The dopant precursor is present in the solution in an amount of 0.001 to 15, preferably 0.003 to 5, and more preferably 0.004 to 1 weight percent (wt %), based on the total weight of the solution. In a preferred embodiment, the dopant precursor is present in the solution in an amount of 0.005 to 0.2 weight percent, based on the total weight of the solution.

The polymer used to hydrogen bond or ionically bond with the dopant precursor is a copolymer that can self-assemble when present in a solvent with the dopant precursor. The copolymer can be a thermoplastic copolymer, a blend of thermoplastic copolymers, a thermosetting copolymer, or a blend of thermoplastic copolymers with thermosetting copolymers. The copolymer may be an alternating, block, random or graft copolymer. The copolymer may have a structure that is dendritic, star, branched or cyclic, or the like. In an exemplary embodiment, the copolymer is a block copolymer that can undergo self-assembly when present in a solvent with the dopant precursor.

The self-assembling capabilities of the copolymer in solution may result in the formation of a variety of different geometries in the film or in solution. Examples of such geometries include spherical domains, cylindrical blocks, lamellar blocks, and the like. Each one of these geometries is characterized in that they have a periodicity between repeating structures of the self-assembly. This periodicity permits deposition of the dopant at periodic sites on the substrate. It also permits uniform deposition of the dopant at these periodic sites resulting in a uniform concentration of the dopant at these sites. In an exemplary embodiment, the copolymer may form spherical domains when cast as a film.

In one embodiment, the copolymer may be crosslinked prior to being subjected to rapid thermal annealing and after being disposed on the substrate or alternatively during the rapid thermal annealing while being disposed on the substrate.

The copolymer hydrogen bonds or bonds ionically with the dopant precursor in solution. The copolymer used to facilitate self-assembly may comprise at least two polymers selected from the group consisting of polyacetals, polyolefins, polyacrylic acids, polymethacrylic acids, polyacrylates, polymethacrylates, polystyrenes, polyarylsulfones, polyethersulfones, polyphenylene sulfides, polyvinyl chlorides, polysulfones, polytetrafluoroethylenes, polyetherketones, polyether etherketones, polyether ketone ketones, polyphthalides, polyanhydrides, polyvinyl ethers, polyvinyl thioethers, polyvinyl alcohols, polyvinyl ketones, polyvinyl halides, polyvinyl esters, polysulfonates, polysulfides, polythioesters, polysulfones, polyesters, polyethylene terephthalate, polybutylene terephthalate, polyesters, polytetrafluoro ethylene, fluorinated polymers, epoxy polymers, vinyl polymers, benzocyclobutene polymers, acrylic polymers, alkyd polymers, phenol-formaldehyde polymers, novolac polymers, resole polymers, hydroxymethylfuran polymers, diallyl phthalate polymers, or the like, or a combination comprising at least one of the foregoing polymers. As noted above, block copolymers are preferred.

Examples of block copolymers are polystrene-block-poly (4-vinyl pyridine), polystrene-block-poly(2-vinyl pyridine), polystrene-block-poly(phenylquinoline), polystyrene -block-poly(lactic acid), polystyrene-block-poly(hydroxystyrene), polystyrene-block -poly(ethylene oxide), polystyrene-block-poly(2-(dimethylamino)ethyl methacrylate), polystyrene-block-poly(N,N-dimethylaminostyrene), poly (methyl methacrylate)-block-poly(N,N-dimethylaminostyrene), poly(methyl methacrylate)-block-poly(2-(dimethylamino)ethyl methacrylate), poly(methyl methacrylate)-block-poly(acrylic acid), poly(methyl methacrylate) -block-poly(aminopropylacrylate), polydimethylsiloxane-block-poly(2-(dimethylamino)ethyl methacrylate), polydimethylsiloxane-block-poly(N,N-dimethylamino styrene), poly(styrene-b -methyl methacrylate), poly(styrene-b-alkenyl aromatics), poly(isoprene-b-ethylene oxide), poly (ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b -propylene oxide), poly(styrene-b-tetrahydrofuran), poly (styrene-b-isoprene-b-ethylene oxide), poly(styrene-b-trimethylsilylmethyl methacrylate), poly(methyl methacrylate-b -dimethylsiloxane), poly(methyl methacrylate-b-trimethylsilylmethyl methacrylate), or the like, or a combination comprising at least one of the foregoing block copolymers.

In another embodiment, the copolymer is a carboxylated olefin copolymer. In other words, one block of the copolymer is a carboxylated olefin copolymer. The carboxylated olefin copolymer comprises an ethylene or propylene polymer that has grafted thereto an unsaturated carboxylic acid or an anhydride, ester, amide, imide or metal salt thereof, hereafter designated as "grafting compound". The grafting compound preferably is an aliphatic unsaturated dicarboxylic acid or an anhydride, an ester, amide, imide or metal salt derived from such acid. The carboxylic acid preferably contains up to 6, more preferably up to 5 carbon atoms.

Examples of unsaturated carboxylic acids are maleic acid, fumaric acid, itaconic add, acrylic acid, methacrylic acid, crotonic acid, and citraconic acid. Examples of derivatives of unsaturated carboxylic acids are maleic anhydride, citraconic anhydride, itaconic anhydride, methyl acrylate, methyl methacrylate, ethyl acrylate, ethyl methacrylate, butyl acrylate, butyl methacrylate, glycidyl acrylate, glycidyl methacrylate, monoethyl maleate, diethyl maleate, monomethyl fumarate, dimethyl fumarate, monomethyl itaconate, diethyl itaconate, acrylamide, methacrylamide, monomaleamide, dimaleamide, N,N-diethylmaleamide, N -monobutylmaleamide, N,N-dibutylmaleamide, mono fumaramide, difumaramide, N -monoethylfumaramide, N,N-diethylfumaramide, N-monobutylfumaramide, N,N -dibutylfumaramide, maleimide, N-butylmaleimide, N-phenylmaleimide, sodium acrylate, sodium methacrylate, potassium acrylate, and potassium methacrylate. Glycidyl methacrylate is the preferred grafting compound. One or more, preferably one, grafting compound is grafted onto the olefin polymer.

In one embodiment, the copolymer can contain an acid group that is either unneutralized or neutralized with a metal salt. Examples are ethylene-acrylic acid copolymer, ethylene-methacrylic acid copolymer, propylene-acrylic acid copolymer, propylene-methacrylic acid copolymer, copolymers of an olefin maleic anhydride grafted polyethylene, polystyrene sulfonic acid, or the like, or a combination comprising at least one of the foregoing copolymers. In one embodiment, the acid group can be neutralized with a metal salt. The acid or basic species in the substrate can be neutralized with a metal salt. Cations used in the neutralization by metal salts are Li$^+$, Na$^+$, K$^+$, Zn$^{2+}$, Ca$^{2+}$, Co$^{2+}$, Ni$^{2+}$, Cu$^{2+}$, Pb$^{2+}$, and Mg$^{2+}$. Alkali metal salts are preferred.

The weight average molecular weight of each block ranges from 3000 to 250000 grams per mole, preferably 6000 to 175000 grams per mole and more preferably 8000 to 135000 grams per mole. The weight average molecular weight of the copolymer ranges from 6000 to 500000 grams per mole, preferably 12000 to 350000 grams per mole and more preferably 16000 to 150000 grams per mole.

An exemplary copolymer is polystyrene-block-poly(4-vinylpyridine). The polystyrene block has a weight average molecular weight of 30000 to 150000 grams per mole, preferably 33000 to 135000 grams per mole, while the weight average molecular weight of the poly(4-vinylpyridine) block has a weight average molecular weight of 2000 to 35000 grams per mole and preferably 6000 to 30000 grams per mole.

The copolymer is present in the solution in an amount of 0.05 to 35 weight percent, based on the total weight of the solution. In a preferred embodiment, the copolymer is present in the solution in an amount of 0.1 to 0.5 weight percent, based on the total weight of the solution.

In one method of doping the semiconducting substrate, the dopant precursor and the copolymer is solubilized in a solvent and disposed on the substrate. The substrate is then optionally treated with through a spin drying, vacuum drying or thermal baking process to substantially evaporate the casting solvent. The substrate with the polymer disposed thereon is then subjected to rapid thermal annealing (also termed heating) to remove the solvent and to facilitate the doping of the semiconducting substrate.

The solvent may be a polar or a non-polar solvent. Examples of solvents are pentane, cyclopentene, alcohols (e.g., methanol, ethanol, butanol, and the like) hexane, cyclohexane, benzene, toluene, 1,4-dioxane, chloroform, tetrahydrofuran, diethyl ether, xylene, mesitylene, propylene glycol methyl ether acetate, n-butyl acetate, benzene, toluene, methylene chloride, carbon tetrachloride, hexane, diethyl ether, or the like, or a combination comprising at least one of the foregoing. Co-solvents may be used if desired. An exemplary solvent is toluene and/or methanol.

The solvent is present in the solution in an amount of 65 to 99.95, preferably 75 to 98 and more specifically 85 to 95 weight percent, based on the total weight of the solution. In a preferred embodiment, the solvent is present in the solution in an amount of 99.5 to 99.0 weight percent, based on the total weight of the solution.

The copolymer and the dopant precursor are added to the solvent to form a solution. The solution may be subjected to agitation and to an increased temperature in order to facilitate solvation of the polymer. The solution is then disposed upon the substrate surface. The substrate surface may be pre-cleaned by heating or by washing in a solvent prior to disposing the solution on it.

The solution may be disposed on the substrate by spin coating, drop casting, doctor blading, spray coating, dip coating, screen printing, brush coating, and the like. A preferred method for coating the substrate is via spin coating. The solvent can be evaporated from the substrate surface leaving the copolymer coating disposed on the substrate. The copolymer coating contains the dopant.

FIG. 1 is a schematic depiction of an exemplary method of disposing the dopant on a substrate. In this method, the block copolymer and the dopant precursor are disposed in a solvent. The block copolymer may complex with or encapsulate the dopant precursor and phase segregates to form spherical domains in the solvent as shown in the FIG. 1(a).

FIG. 1(b) shows the solution after it is disposed upon a substrate. As can be seen in the FIG. 1(b), the spherical domains with the dopant precursor embedded therein may promote the formation of periodically spaced structures on the surface of the substrate. An annealing process may be used to promote the formation of the spherical phase separated domains in the film. Annealing processes include thermal annealing, solvent vapor annealing, microwave annealing and gradient thermal annealing. Upon heating the polymer and substrate, the copolymer decomposes leaving behind concentrated domains of the dopant within the substrate. As can be seen in the FIG. 1(c), these domains are periodically spaced.

The copolymer coating (e.g., the layer of spherical domains in the FIG. 1(b)) acts as its own capping layer, eliminating the need for the high-vacuum evaporation of a metal-oxide layer, such as a silica layer, that is generally used in existing monolayer doping procedures. Furthermore, because the semiconductor substrate is coated with the polymer film rather than being covalently attached, the need for a non-oxidative ambient condition may also be eliminated.

The thickness of the copolymer coating may range from a few nanometers to a few hundred nanometers (nm), preferably 3 to 250 nm, and more preferably 5 to 200 nm and even more preferably 6 and 120 nm. However, it is contemplated that thinner films could be used, so long as care is taken to avoid pinholes, which would lead to non-uniform doping. Thicker films may also be used if desired if care is taken to minimize the presence of increased organic residue on the semiconductor substrate after annealing.

The substrate along with the copolymer coating disposed thereon is then subjected to annealing (rapid thermal annealing-RTA) to a temperature of 500 to 1500° C., preferably 700 to 1300° C. for a period of 0.001 seconds to 24 hours, preferably for 0.01 seconds to 12 hours, and more preferably for 0.1 seconds to 3 minutes. Annealing may be conducted by using heating convection, conduction or radiation heating. Convective heating is preferred during the annealing process.

The annealing may be conducted in a vacuum or alternatively in an inert atmosphere. Suitable inert atmospheres include nitrogen, argon, neon, helium, nitrogen or carbon dioxide. In a preferred embodiment, the annealing is conducted in an inert atmosphere that contains argon.

The resulting dopant concentration profile within the substrate is a function of the annealing temperature and time for which the substrate and the polymer coating is subjected to diffusion. Other influential factors are the solubility of the dopant molecule in semiconductor substrate at the annealing temperature and the diffusion coefficient of the dopant molecule at the annealing temperature. The annealing time and temperature could thus be varied as needed to achieve the desired dopant profile. Thus, doped junctions as shallow as sub-5 nm may be obtained using appropriately low annealing temperatures and short annealing times.

During the annealing, any residual solvent from the polymer coating evaporates, leaving behind only the polymer. The dopant from the dopant containing polymer diffuses into the substrate to a depth of 0.01 to 1000 nm, preferably 0.05 to 100 nm, preferably 0.09 to 50 nm and more preferably 0.1 to 10 nm. The polymer may also degrade and degradation products can evaporate from the substrate.

In one embodiment, the dopant domain size and the periodicity of the dopant domains is dependent upon the molecular weight of the copolymer. The periodicity of the domain spacing increases with increasing molecular weight of the copolymer. As the molecular weight of the block increases, the average dopant domain increases in size and the average periodicity increases as well.

In one embodiment, the average dopant domain size is 2 to 100 nanometers. Average dopant domain size is the average radius of the dopant domains. In another embodiment, the average periodicity of the dopant domains is 2 to 200 nanometers.

This method of doping facilitates the formation of junctions for source, drain, and channel extension regions in electronic devices and articles such as transistors with fast switching speeds and high packing densities. Additional applications include, but are not limited to, transistor gates, nanostructures, diodes, photodetectors, photocells, and integrated circuits.

The method of doping detailed herein is exemplified by the following non-limiting examples.

EXAMPLE

Example 1

This example demonstrates the manufacturing of a doped substrate using a block copolymer with hydrogen bonding capabilities that interacts with a dopant precursor to form spherical domains.

Figure 2B:
FIG. 2B shows the structure of the dopant 4-hydroxyphenyl boronic acid pinacol ester.
Figure 2C:
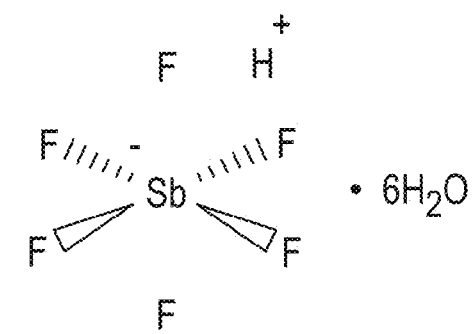
FIG. 2C shows the structure of the dopant fluoroantimonic acid hexahydrate.

In this example, polystyrene-b-poly 4-vinylpyridine (PS-b-P4VP) polymer is the block copolymer, 4-hydroxyphenyl boronic acid pinacol ester and fluoroantimonic acid hexahydrate are used as dopant precursors. The structure of the polymer and the dopants is depicted in the FIG. 2. The solvent is toluene and methanol.

Polystyrene-b-poly 4-vinylpyridine (PS-b-P4VP) polymers of different molecular weights (shown in Table 1 below) were purchased from Polymer Source and were used as received. First, the polymer was dissolved in anhydrous toluene (5 mg/mL) and stirred at 50° C. for 5 h. In a separate vial the appropriate dopant precursor from FIG. 2 was dissolved in 1 mL methanol. Then, the dopant precursor solution of different amounts was added to 1 mL of the polymer solution to afford solutions with different polymer-to-dopant precursor mole ratio (1:0.1-1:0.5). The combined solution was stirred at room temperature for 24 hours and subsequently filtered through a 0.45 micrometer (μm) PTFE filter. This synthesis produced dopant containing PS-b-P4VP spherical domains of different sizes and dopant concentrations that are useful to dope discrete nanometer confined volumes of silicon substrates when assembled on the substrate surface and thermally annealed. Examples of assembly and annealing process, in addition to evidence of utility are provided below.

TABLE 1

| Name | M.W.$_{Total}$ (g · mol$^{-1}$) | M.W.$_{PS}$ (g · mol$^{-1}$) | M.W.$_{P4VP}$ (g · mol$^{-1}$) |
|---|---|---|---|
| Set 1 | 34000 | 27000 | 7000 |
| Set 2 | 76000 | 57500 | 17500 |
| Set 3 | 129000 | 109000 | 27000 |

Polystyrene-b-poly(4-vinylpyridine) (PS-b-P4VP) is a classical diblock copolymer that is known to self-assemble in 'apolar' solvents like toluene into spherical micelle-like aggregates with a P4VP core and a PS shell. Since the self-assembly occurs in the solution phase, the morphology of these aggregates is independent of the volume fractions of the two blocks and all assemble into spherical aggregates in toluene. The aggregation numbers in these assemblies for strongly segregated diblock copolymers has been shown to depend on the volume fractions of the constituent blocks:

$$Z=Z_0(N_A^{\alpha} \cdot N_B^{-\beta})$$

where $N_A$ and $N_B$ are the degrees of polymerization for the 'core' and the 'shell' blocks, respectively. For PS-b-P4VP, $Z_0=1.66$, $\alpha=1.93$ and $\beta=-0.73$. Thus, the relative sizes of the PS shell and P4VP core can be easily tuned by varying $N_A$ and $N_B$ in a range of 20 to 60 nm.

Figure 3A:
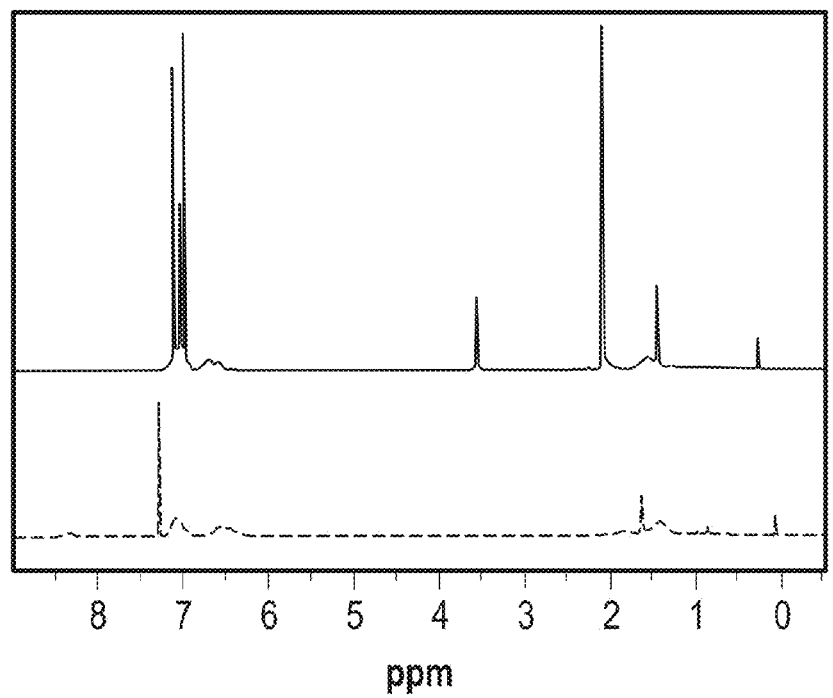
FIG. 3A shows resonance from the P4VP protons that occurs at a chemical shift of ∂=8.5 ppm when the polymer chains are dissolved in CDCl3. It is evident that since chloroform is a good solvent for both PS and P4VP blocks, the polymer chains are in the unaggregated state; it also shows that the above resonance at ∂=8.5 ppm disappears when the polymer chains are dissolved in $d_8$-Toluene. Since toluene is a good solvent for the PS block but a poor solvent for the P4VP block, the polymer chains are in the aggregated state, where the P4VP blocks form the interior (core) of these aggregates while the PS blocks form the exterior (shell).

$^1$H NMR spectroscopy is sensitive to changes in local environment. For instance, as shown in the FIG. 3(A), resonance from the P4VP protons occurs at a chemical shift of ∂=8.5 ppm when the polymer chains are dissolved in CDCl$_3$. It is evident that since chloroform is a good solvent for both PS and P4VP blocks, the polymer chains are in the unaggregated state. On the contrary, the $^1$H NMR spectrum of the same polymer recorded in d$_8$-toluene shows a marked absence of P4VP proton resonance peaks. This is indicative of retarded relaxation of P4VP protons in toluene where the polymer chains mainly exist in the aggregated form.

Figure 3B:
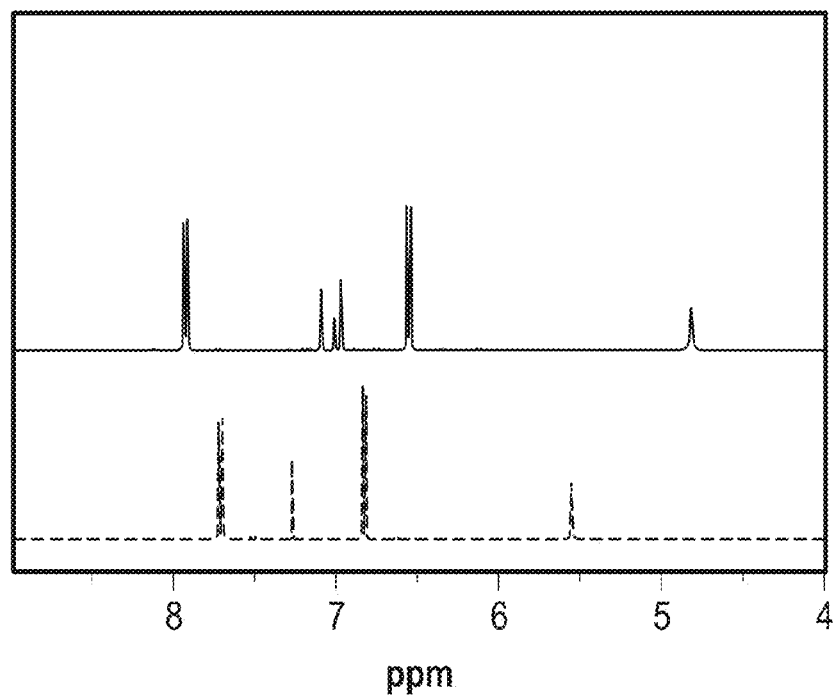
FIG. 3B shows the 1H NMR spectra of the 4-hydroxyphenyl boronic acid pinacol ester small molecule in d8-Toluene (red) and CDCl$_3$ (black)
Figure 4A:
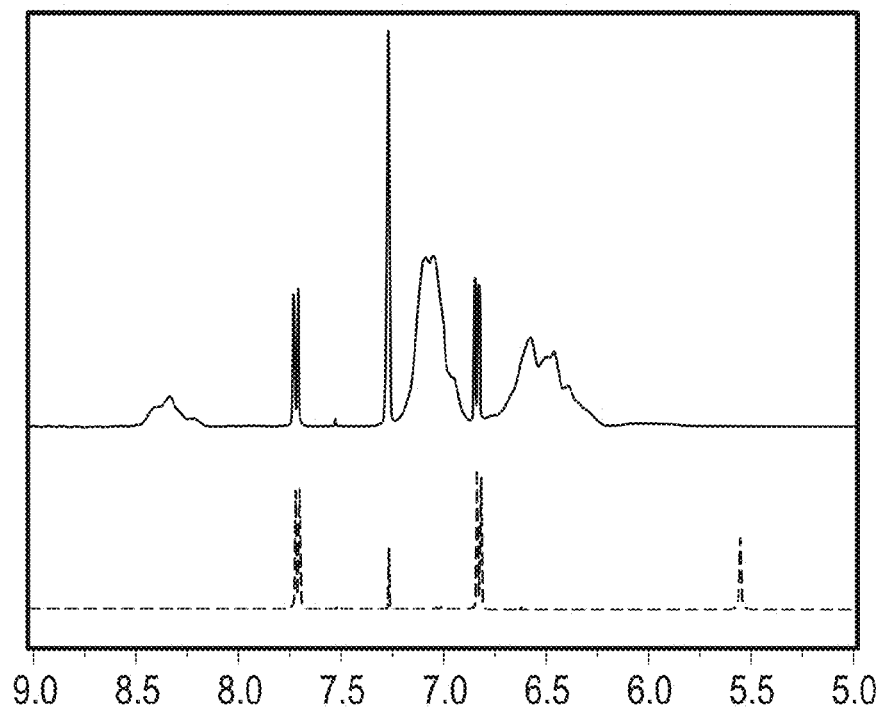
FIG. 4A shows the 1H NMR spectra of polymer+SM mixture in CDCl$_3$.
Figure 4B:
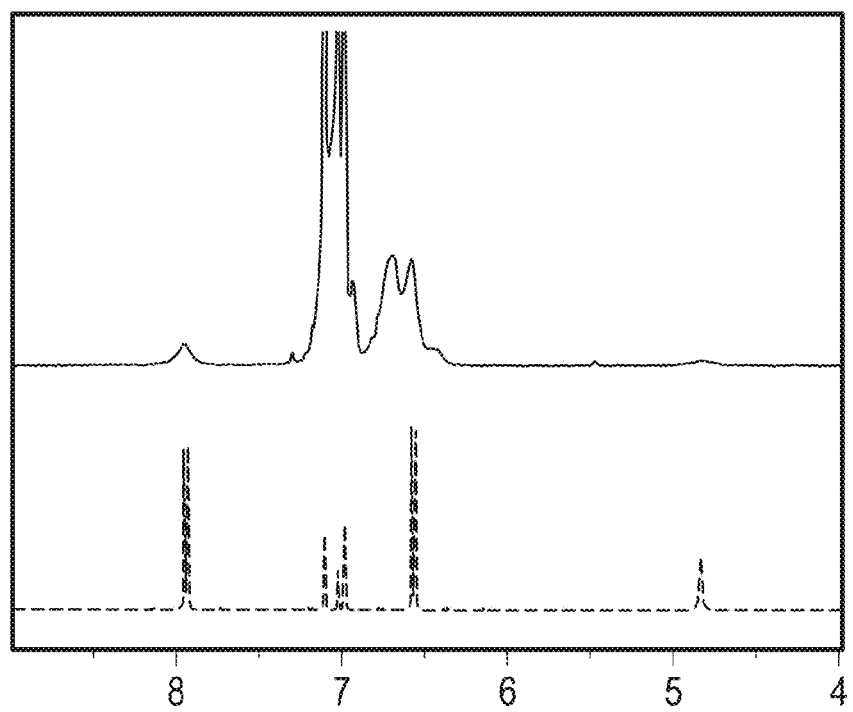
FIG. 4B shows the 1H NMR spectra of polymer+SM mixture in d8-toluene.

The $^1$H NMR spectra of the 4-hydroxyphenyl boronic acid pinacol ester small molecule (hereafter SM$_B$) are shown in FIG. 3(B). As expected the chemical shifts for the protons are different in CDCl$_3$ and d$_8$-toluene. In both solvents, the phenolic —OH proton appears as a distinct singlet peak at ∂=4.75 ppm (toluene) and ∂=5.6 ppm (chloroform). Mixing the SM$_B$ with PS-b-P4VP in CDCl$_3$ results in complexation as is evident from the disappearance of the phenolic —OH peak as shown in FIG. 4. FIG. 4 shows the 1H NMR spectra of polymer+SM mixture in a) CDCl$_3$ and b) in d$_8$-toluene. Furthermore, the resonance from the aromatic protons around ∂=6.75-7.75 ppm confirms the presence of the SM$_B$ in the complex. On the other hand, when this complexation is performed in d$_8$-toluene, no resonance peaks from the aromatic protons of SM$_B$ are observed. This is indicative that the SM$_B$ been successfully encapsulated inside the polymer spherical domains owing to its complexation with the P4VP block.

Successful encapsulation of the SM$_B$ is supported further by the FT-IR spectra recorded on different P4VP-SM$_B$ complexes in thin film geometry. As the ratio SM$_B$:P4VP increases, the changes in the intensity and frequency of certain peaks can clearly be discerned.

Figure 5:
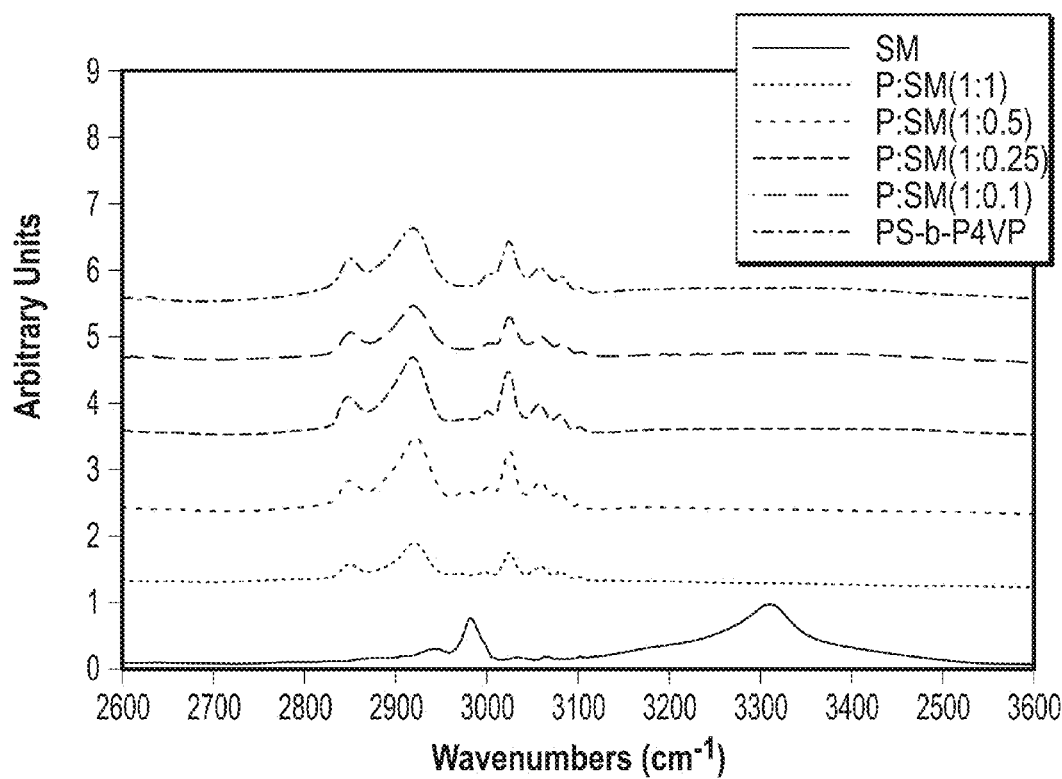
FIG. 5 shows a portion of the FT-IR spectra of polymer-SMB system.

A portion of the FT-IR spectra of polymer-SM$_B$ system is shown in FIG. 5. Films were prepared by drop casting the polymer-SM solutions (as prepared above) onto NaCl pellets. The broad peak around 3300 cm$^{-1}$ is characteristic of the phenolic —OH present in the SM$_B$. However, complexation with PS-b-P4VP either due to hydrogen bonding or protonation, results in the disappearance of this peak. These data further show that the 4-hydroxyphenyl boronic acid pinacol SM interacts with the polymer via the phenolic —OH group in solid state.

Example 2

This example was conducted to demonstrate assembling dopant polymer films via spin casting. Polymer films of varying thickness (20 nm-30 nm) were spun-cast onto silicon substrates from the filtered toluene/methanol solution at speeds between 2000-3000 rpm. 5 mg of the block copolymer was dissolved in 1 mL toluene and stirred at 60° C. for 4 hours. 10 mg of boronic acid pinacol ester (SM$_B$) was dissolved in 1 mL methanol to give a final solution of 10 mg/mL. Appropriate amounts of this solution (0.01 mL-0.1 mL) were then added to the polymer solution to afford different solutions with polymer-to-dopant ratios varying between 1:0.1-1:1. These solutions were stirred at room temperature for 12-24 hours and filtered through a 0.45 µm PTFE filter. 75 microliters (µL) of the appropriate solution were placed on a 1×1 cm square piece of cleaned silicon substrates and spun at speeds between 2000-3000 rpm. The solvent was allowed to evaporate in ambient conditions to produce dried films. The nominal thickness of these films was between 20-30 nm and found to depend on the molecular weight of the block copolymer (see Table 1 for molecular weights of the polymers used). The spherical domain P4VP block containing dopant molecules assemble on a silicon substrate in hexagonal closed pack morphology. The polystyrene block fills interstitial space defining the inter-sphere domain distances. Table 2 lists the spherical domain aggregate size and spacing of PS-b-P4VP polymer thin films deposited on silicon. The incorporation of small molecules listed in FIG. 2 did not change size, shape or morphology of spherical domains assembled from PS-b-P4VP thin films.

TABLE 2

| Block copolymer | Spherical Domain Aggregate Size (nm) | Edge to Edge Inter-domain distance (nm) |
|---|---|---|
| $PS_{27k}$-b-$P4VP_{7k}$ | 20 | 10 |
| $PS_{58k}$-b-$P4VP_{18k}$ | 30 | 25 |
| $PS_{109k}$-b-$P4VP_{27k}$ | 40 | 50 |

Diffusion of dopants from the dried polymer films into the underlying substrates was afforded via spike rapid thermal annealing (RTA) to result in confined doping on the nanometer length scale. The substrates were thermally annealed under an inert Ar atmosphere by heating from room temperature to different temperatures (600° C.-1000° C.) over 5 seconds and held at these temperatures for annealing times between 0.1 seconds and 60 seconds, followed by a rapid cooling back to room temperature.

Figure 6A:
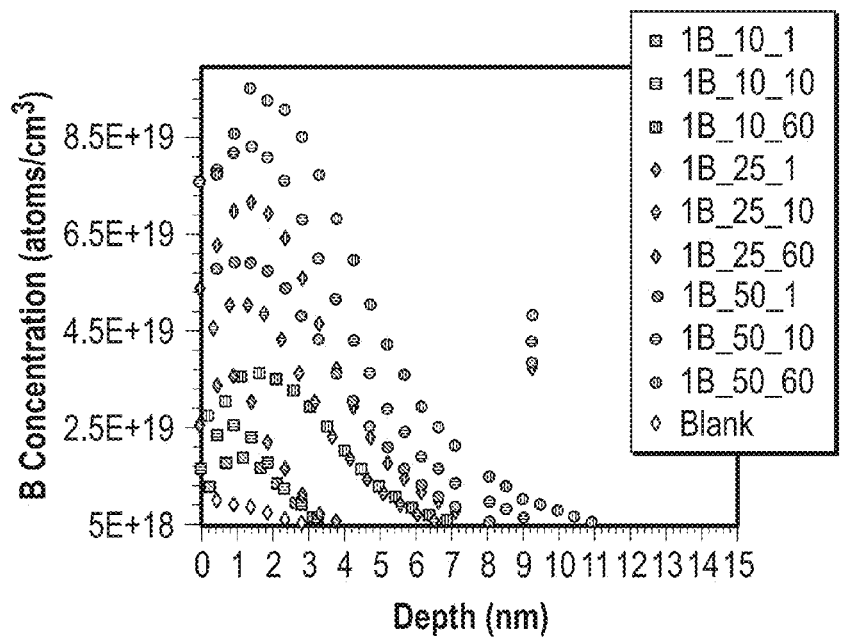
FIG. 6A shows SIMS concentration profiles on substrates after spike-RTA at 900° C. for 1 second (green), 10 seconds (blue) and 60 seconds (red) as a function of polymer (P4VP)-to-SM$_B$ molar ratios—1:0.1 (squares), 1:0.25 (diamonds) and 1:0.5 (circles); Boron concentration profiles for low molecular weight (PS27k-b-P4VP7k) polymer.
Figure 6B:
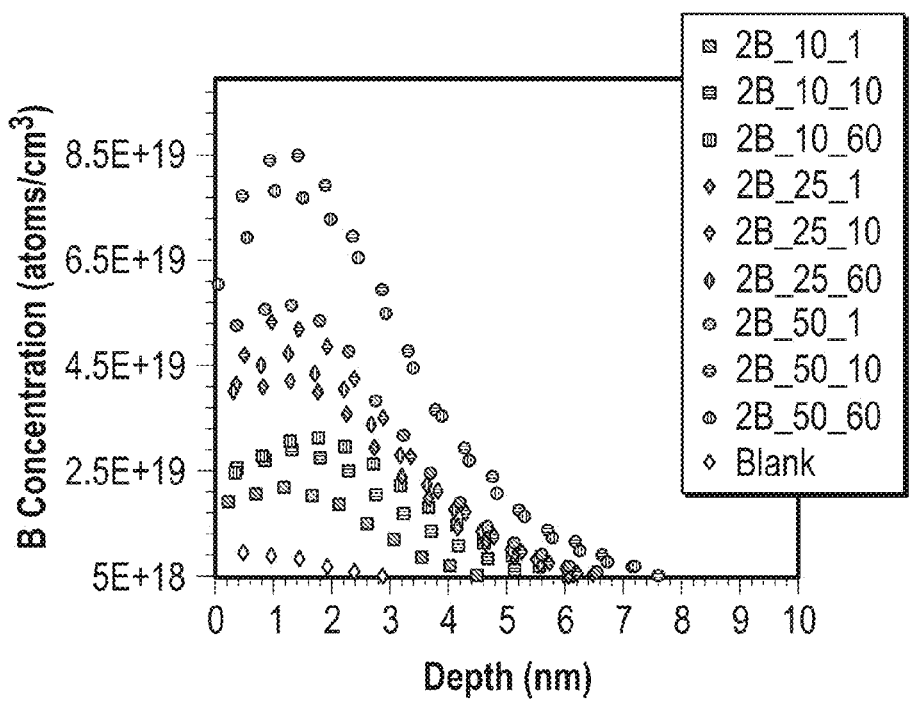
FIG. 6B shows SIMS concentration profiles for medium molecular weight (PS58k-b-P4VP18k) polymer
Figure 6C:
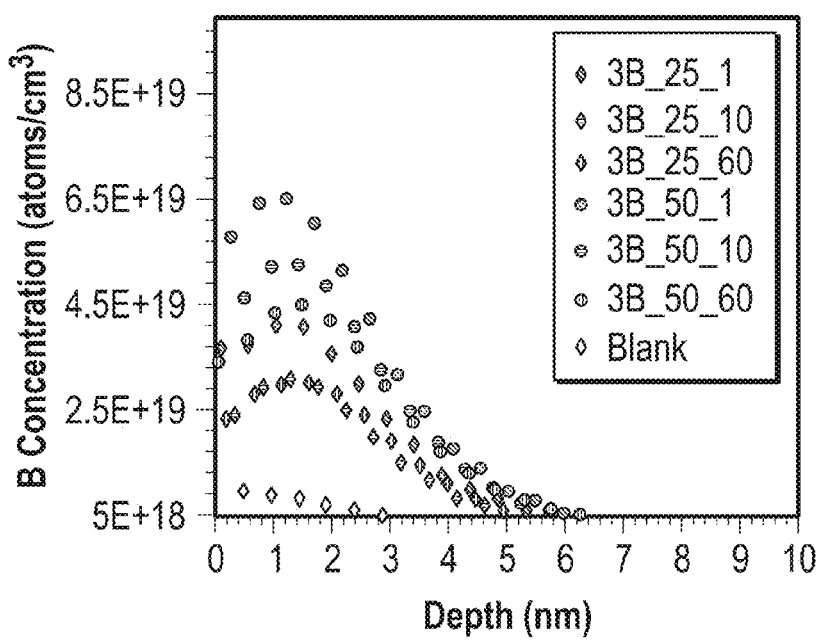
FIG. 6C shows SIMS concentration profiles for high molecular weight (PS109k-b-P4VP27k) polymer; the gray data points correspond to the boron concentration profile obtained from a blank Si substrate after spike-RTA at 900° C. for 30 seconds.

Diffusion depth profiles of the dopants into the underlying Si substrates were determined using secondary ion mass spectrometry (SIMS) with ion sputtering. As is evident from the SIMS sputtering profiles in FIG. 6, the boron concentration in a 900° C. RTA anneal for the PS-b-P4VP:$SM_B$ for all molecular weights of the polymer, all annealing times (0.1 seconds-60 seconds) at different molar concentrations (10 mol %-50 mol %) system is limited to the top 15 nm of the substrate surface. More precisely, the boron penetration depth can be estimated to be around 12 nm from the surface. In comparison, the blank substrate by itself does not show appreciable dopant dosage and penetration after RTA.

It should be noted the absolute value of the ion yield during SIMS analysis is very sensitive to the local oxygen concentration. Thus oxidation of the surface of the substrates often leads to misleadingly high concentrations. In the case of the control sample of FIG. 6, the blank Si substrate contains a background concentration of $\sim 10^{16}$-$10^{18}$ B atoms/$cm^3$. Thus at the surface of the substrate a misleading amount of B (gray data points) exist. More appropriately, under identical analytical conditions the relative differences in B concentration between the substrates that were annealed with dopant containing polymer or non-dopant containing polymer is a realistic representation of the actual increase in B dosage induced from the dopant-containing polymer.

It should also be noted that the compositional information obtained from SIMS analysis is averaged over the spot size of the ion beam (~100 µm). Due to this reason, the information about laterally confined doped regions on the nanometer scale is lost and the reported concentrations are underestimates of the locally concentrated dopant domains (theoretically a multiplying factor of 1.75 can be used to adjust for appropriate concentration). As per the section below, electron microscopy was used to elucidate the lateral confinement of doping, but unfortunately this could not be done with the boron doping sample due to lack of Z-contrast between silicon and boron.

Figure 7:
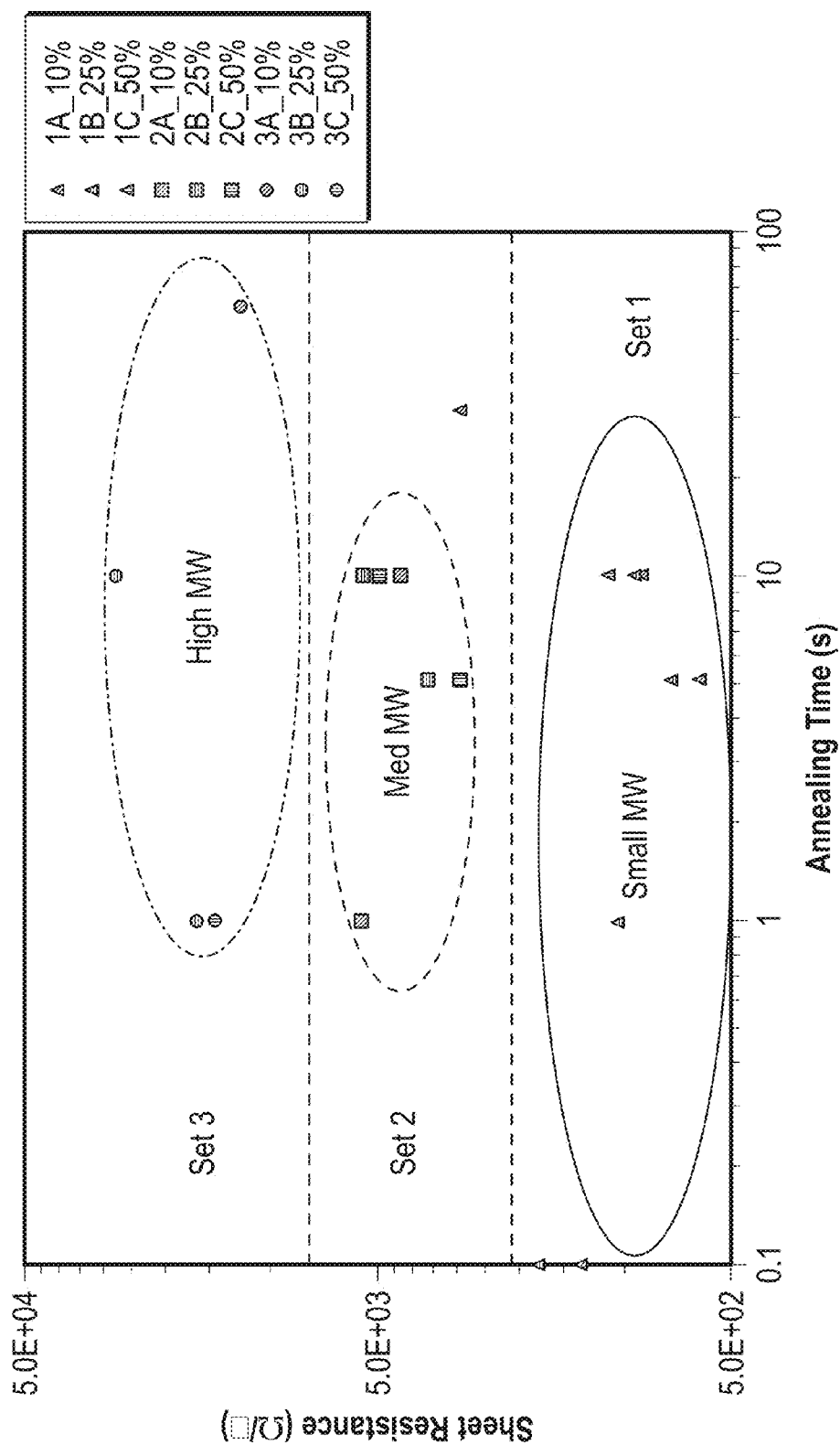
FIG. 7 is a graphical depiction of surface resistance measured using a four-point probe measurement.

The electrical activation of diffused dopants was investigated using the four-point probe measurement and the data are summarized in FIG. 7. Sheet resistance ($R_s$) was measured on all samples analyzed with SIMS. First, there is a clear distinction between $R_s$ values for substrates doped using small, medium and large molecular weight block copolymer templates. The $R_s$ values for the small molecular weight block copolymer (Set 1, $PS_{27k}$-b-$P4VP_{7k}$) are the lowest while those for high molecular weight block copolymer (Set 3, $PS_{109k}$-b-$P4VP_{27k}$) are the highest; $R_s$ values for medium molecular weight block copolymer (Set 2, $PS_{58k}$-b-$P4VP_{18k}$) lie in between the two extremes. Second, due to the highly resistive nature of the junctions, no sheet resistance could be measured for Set 2 and Set 3 junctions formed by very short annealing times, viz. 0.1 s. Since the diffusion of boron in Si is a function of annealing time and temperature, we hypothesize that the higher resistance in Set 2 and Set 3 is due to limited diffusion of boron from adjacent domains. This leads to poorly connected domains. This is reasonable considering that the boron-rich domains in the polymer precursor films are much closely spaced in the low molecular weight PS-b-P4VP films and are progressively further apart with increasing molecular weight (see Table 2).

Figure 8A:
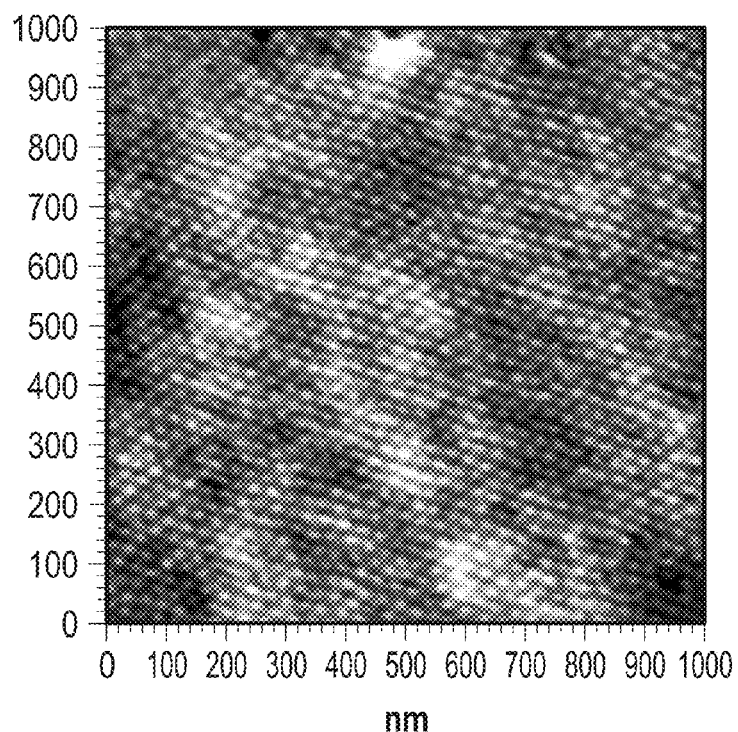
FIG. 8A shows tapping mode AFM images of assembled PS-b-P4VP polymer thin films prior to RTA doping; spherical aggregates of varying size and spacing are clearly visible—each image corresponds to a specific molecular weight: PS27k-b-P4VP7k.
Figure 8B:
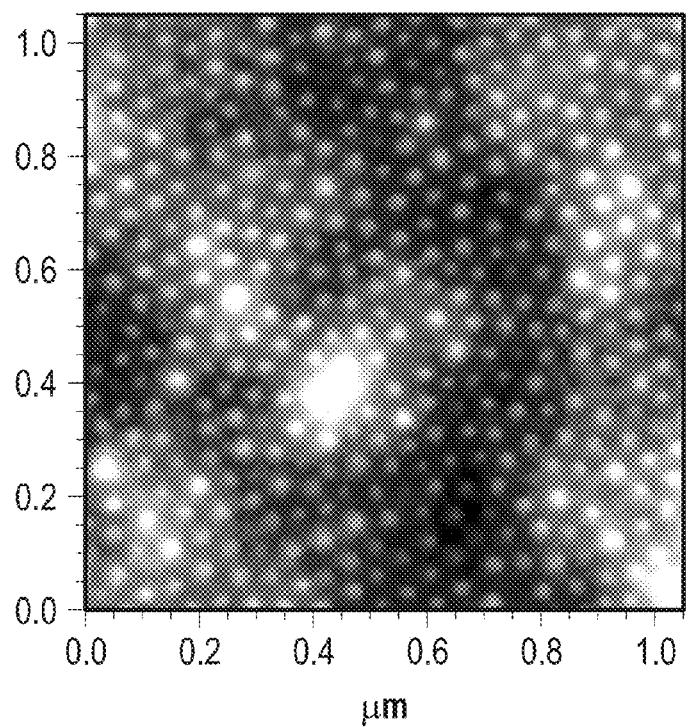
FIG. 8B shows tapping mode AFM images that correspond to PS58k-b-P4VP18k.
Figure 8C:
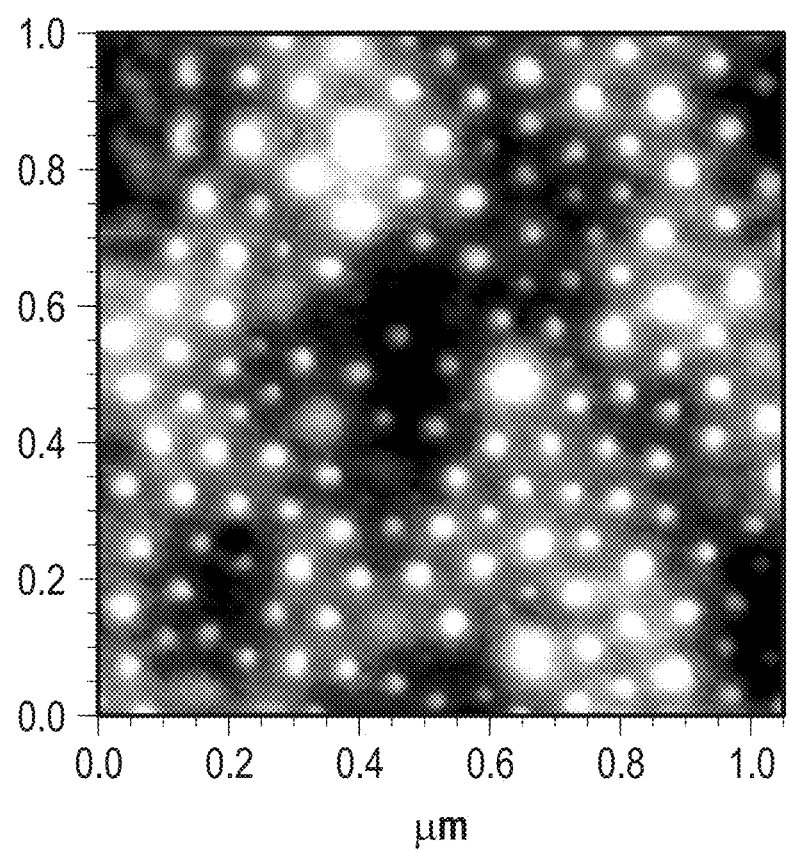
FIG. 8C shows tapping mode AFM images that correspond to PS109k-b-P4VP27k.
Figure 9A:
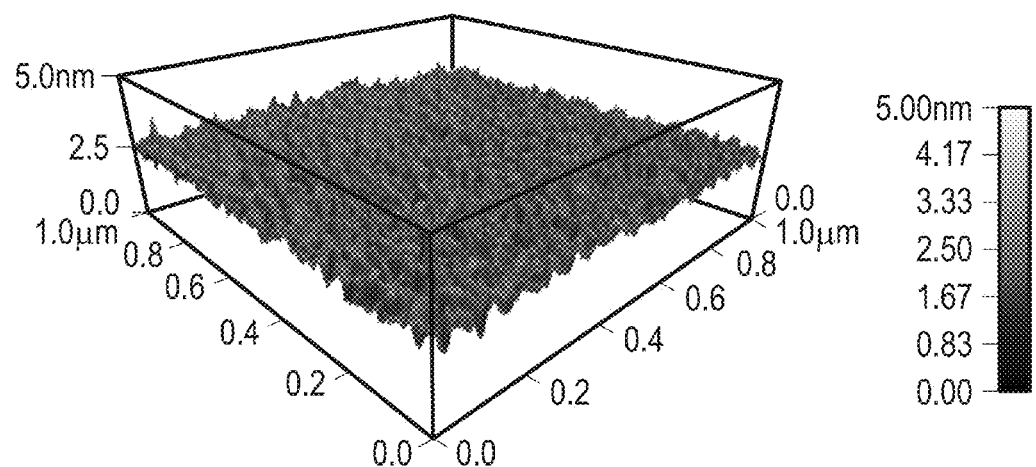
FIG. 9A shows 3-D surface topography of Si substrate.
Figure 9B:
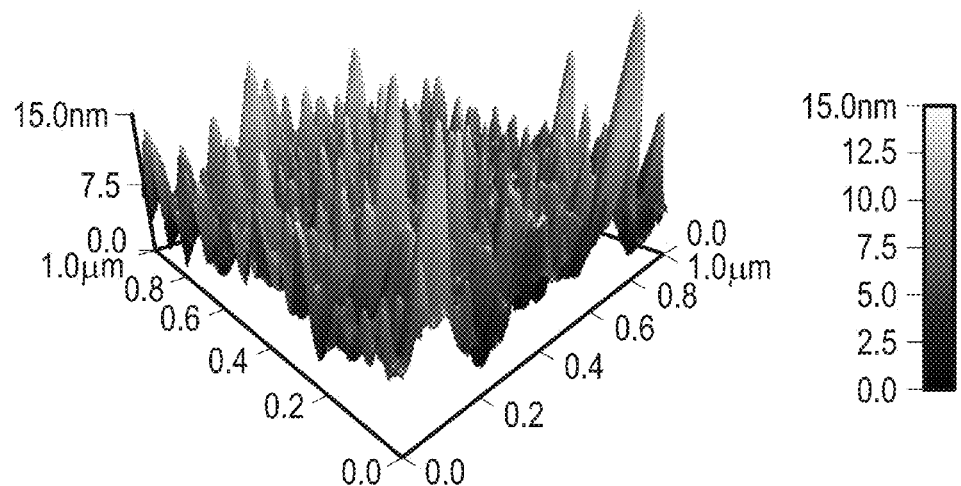
FIG. 9B shows 3-D surface topography of PS$_{58k}$-b-P4VP$_{18k}$:SM$_B$ (1:0.5) film before spike RTA.
Figure 9C:
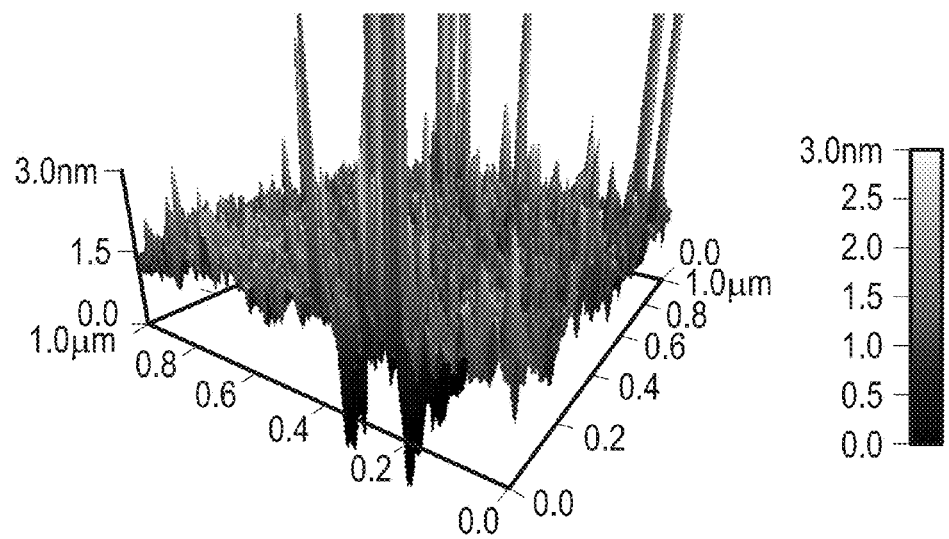
FIG. 9C shows 3-D surface topography of PS$_{58k}$-b-P4VP$_{18k}$:SM$_B$ (1:0.5) film after spike-RTA at 900° C. for 0.1 second.
Figure 9D:
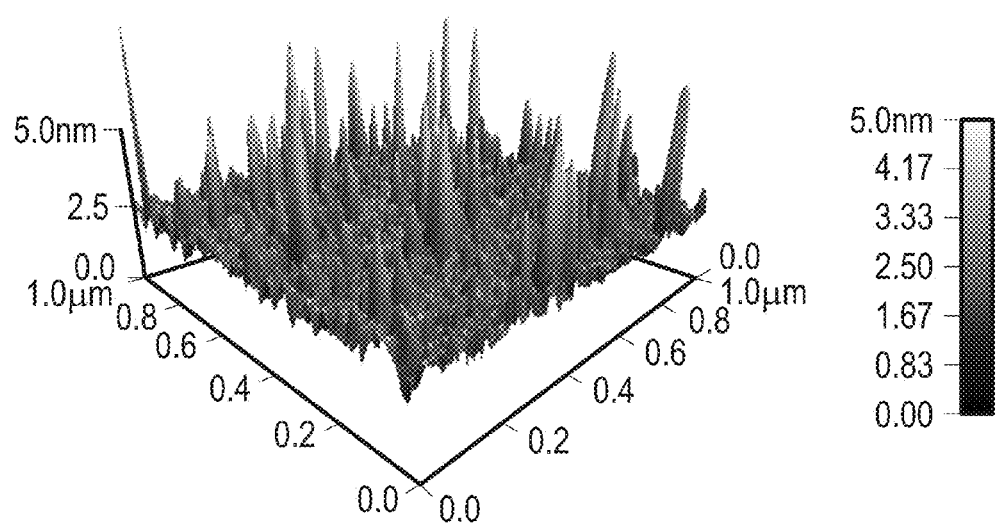
FIG. 9D shows 3-D surface topography of PS58k-b-P4VP18k:SMB (1:0.5) film after spike-RTA at 900° C. for 1 second.
Figure 9E:
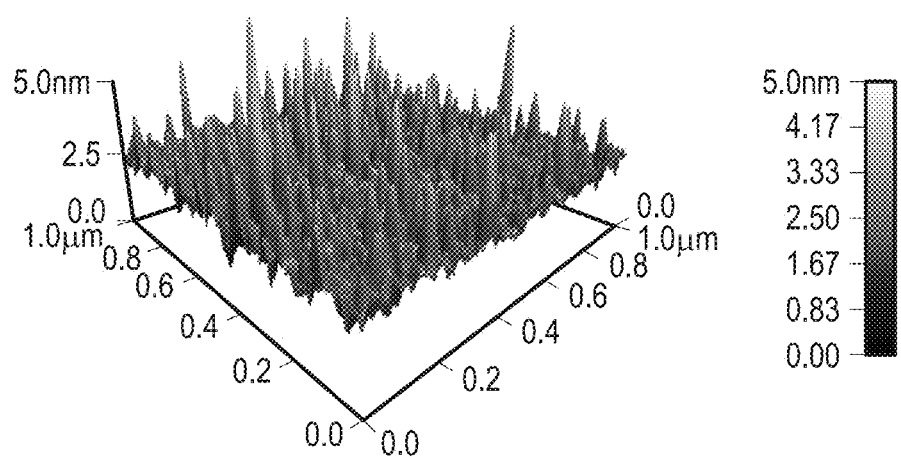
FIG. 9E shows 3-D surface topography of PS58k-b-P4VP18k:SMB (1:0.5) film after spike-RTA at 900° C. for 10 seconds.
Figure 9F:
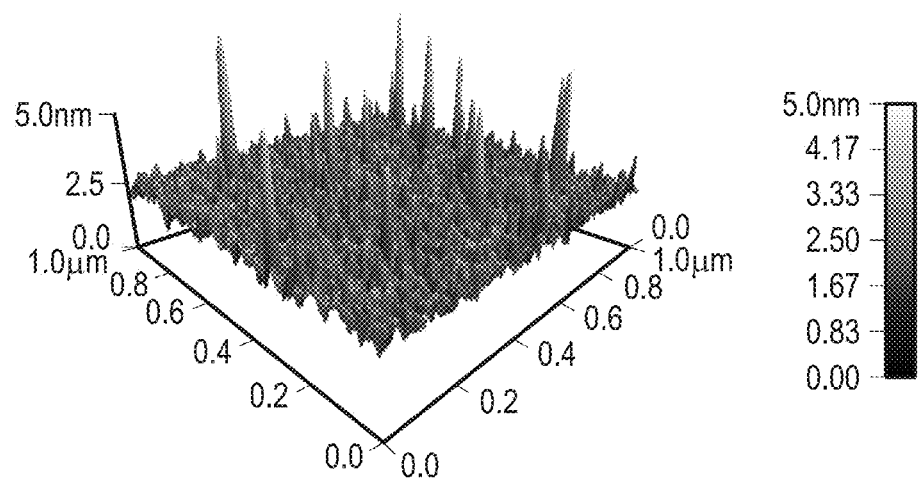
FIG. 9F shows 3-D surface topography of PS58k-b-P4VP18k:SMB (1:0.5) film after spike-RTA at 900° C. for 60 seconds.

FIG. 8 shows tapping mode AFM images of assembled PS-b-P4VP polymer thin films prior to RTA doping; spherical aggregates of varying size and spacing are clearly visible—each image corresponds to a specific molecular weight: a) $PS_{27k}$-b-$P4VP_{7k}$, b) $PS_{58k}$-b-$P4VP_{18k}$, c) $PS_{109k}$-b-$P4VP_{27k}$.

FIG. 9 shows 3-D surface topography of a) Si substrate, b) $PS_{58k}$-b-$P4VP_{18k}$:$SM_B$ (1:0.5) film before spike RTA; $PS_{58k}$-b-$P4VP_{18k}$:$SM_B$ (1:0.5) film after spike-RTA at 900° C. for c) 0.1 seconds, d) 1 seconds, e) 10 seconds and f) 60 seconds. The clean silicon (Si) substrate has surface roughness features of ~1 nm in height whereas after the $PS_{58k}$-b-$P4VP_{18k}$:$SM_B$ polymer was deposited, feature sizes of on average of 15 nm were observed. After RTA anneal, (C-F) surface features decreased to ~5 nm in height, indicative of densification of the spherical domains. Correlating these AFM images with the 4-pt probe analysis and SIM analysis, there is clear evidence that B from the $PS_{58k}$-b-$P4VP_{18k}$:$SM_B$ is incorporated into the Si below and retains electronically (and likely physically) discrete regions that have nanometer confinement.

Example 3

Figure 10A:
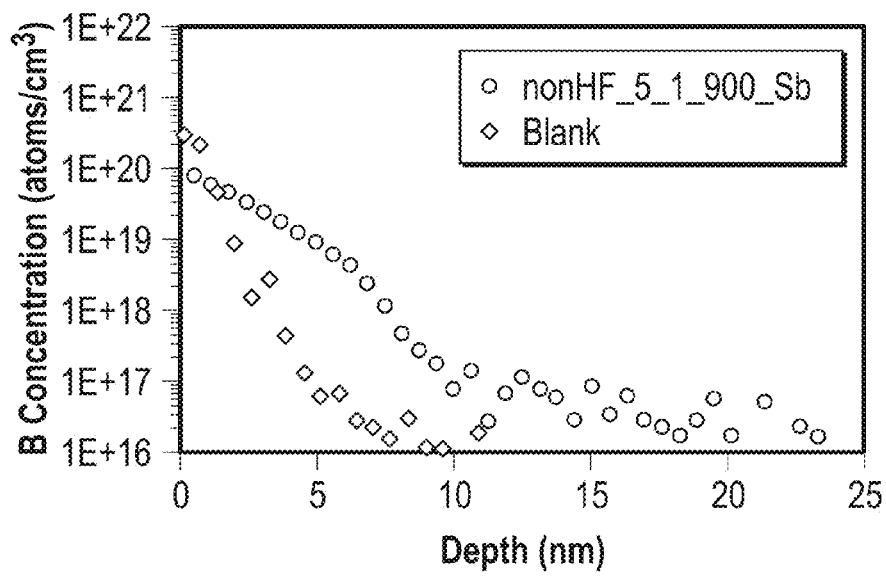
FIG. 10A shows SIMS antimony (Sb) counts on substrates after spike-RTA at 900° C. (green) for 1 second.
Figure 10B:
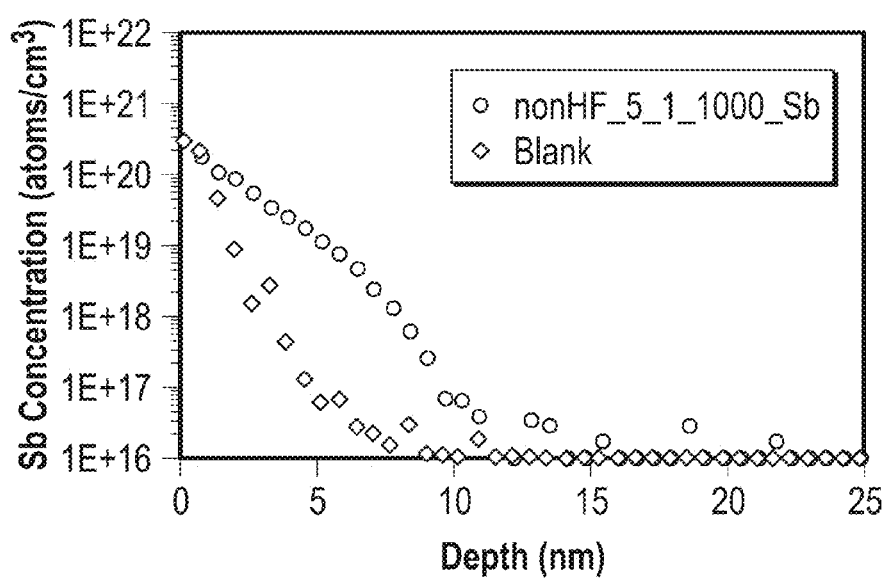
FIG. 10B shows SIMS antimony (Sb) counts on substrates after spike-RTA at 950° C. (blue) for 1 second.

This example was conducted to demonstrate the doping with antimony via spike rapid thermal annealing of block copolymer. To demonstrate the versatility of dopant inclusion with the supramolecular block copolymer RTA doping approach and to assist in electron microscopy characterization a PS-b-P4VP:fluoroantimonic acid hexahydrate (hereafter $SM_{Sb}$) doping system was developed as described above. Similar to the PS-b-P4VP:$SM_B$ system, upon film formation the PS-b-P4VP:SM$_{Sb}$ assembled into hexagonally closed pack phase on silicon substrates. Furthermore upon RTA at 900° C. or 1000° C. for 0.1 second, SIMS depth profiling analysis shows Sb diffusion into the silicon substrate (FIG. 10). FIG. 10 shows SIMS antimony (Sb) concentration profiles on substrates after spike-RTA at 900° C. (green), 950° C. (blue) and 1000° C. (red) for 1 second; the circle data points correspond to the concentration profile of antimony as a function of depth from the surface for a PS$_{27k}$-b-P4VP$_{7k}$: Fluoroantimonic acid hexahydrate SM polymer-to-SM$_{Sb}$ ratio of 1:0.5; the grey data points correspond to the Sb concentration of a blank substrate.

A larger dosage (both higher concentration at the surface and deeper penetration depth) of Sb was observed to diffuse into Si at the higher annealing temperature of 1000° C. Compared to the boron diffusion under exact RTA conditions (900° C. for 1 second), less antimony was observed to thermally diffuse into the Si substrate. This is related to the lower bulk solubility and diffusion coefficient of Sb vs B or P as shown in Table 3.

TABLE 3

| | Diffusion Coefficient of Dopant in Si @ 1100° C. (cm$^2$/sec) | Solubility of Dopant in Si @ 1100° C. (atoms/cm$^3$) |
|---|---|---|
| Antimony | $2 \times 10^{-14}$ | $10^{20}$ |
| Boron/Phosphorous | $2 \times 10^{-13}$ | $5 \times 10^{20}/10^{21}$ |

Figure 11:
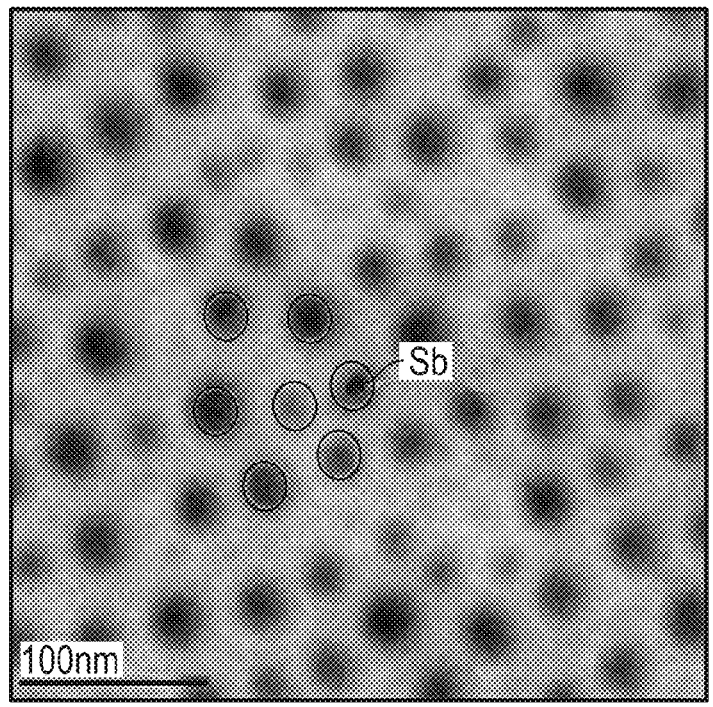
FIG. 11A shows TEM images of Sb clusters embedded in the polymer film (left) before RTA.
FIG. 11B shows TEM images of Sb clusters embedded in the polymer film (right) after spike RTA at 900° C. on Si.
Figure 11:
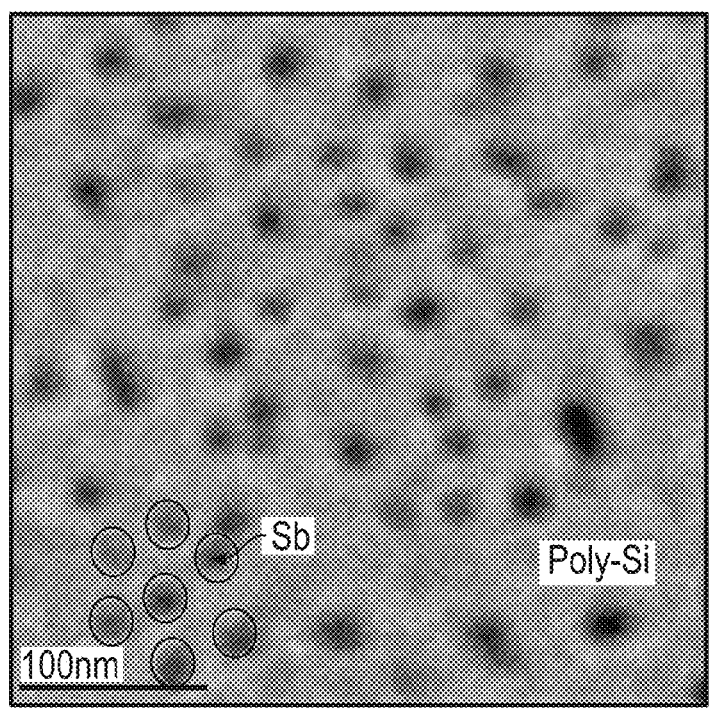

Electron microscopy techniques (TEM-transmission electron microscopy, SEM-scanning electron microscopy) were used to determine spatial information about the Sb dopant containing regions before and after RTA. As previously described, we incorporated antimony (Sb) precursors within our P4VP aggregates in order to facilitate the electron imaging of our nanoconfined-doped regions. Unlike doping on single crystal Si substrates the resulting Sb dopant containing spherical domains with the film were subjected to spike RTA on 15 nm thick polycrystalline Si windows. TEM images before and after annealing are shown in FIG. 11. FIG. 11 shows TEM images of Sb clusters embedded in the polymer film (left) before RTA (right) after spike RTA at 900° C. on Si.

The difference between the micrographs of the polymer film (left) and the post-annealed TEM substrate is very clear. In the former, the Sb clusters (dark circles) embedded in the polymer film are well defined and demonstrate quasi-hexagonally packed order. This morphology is identical to that observed with AFM. These clusters have an average diameter of about 20 nm and a nearest neighbor center-to-center distance of about 30 nm. In the post-annealed substrates, the Sb clusters retain their general shape and hexagonal packed order, but with slight deformity. Preliminary AFM measurements seem to indicate that the surface topography of the substrates after RTA is not flat and does show nanometer-sized domains. However, as shown in FIG. 9, the difference in height of the surface features before (FIG. 9B) and after RTA (FIG. 9C-F) is >10 nm. In conjunction with the SIMS data, it can be concluded that majority of the boron incorporated in the film prior to spike-RTA diffuses into the underlying substrates. Additionally, the discrete nature of the residual surface features post-RTA are indicate at the discreteness of the doped regions as well.

Figure 12:
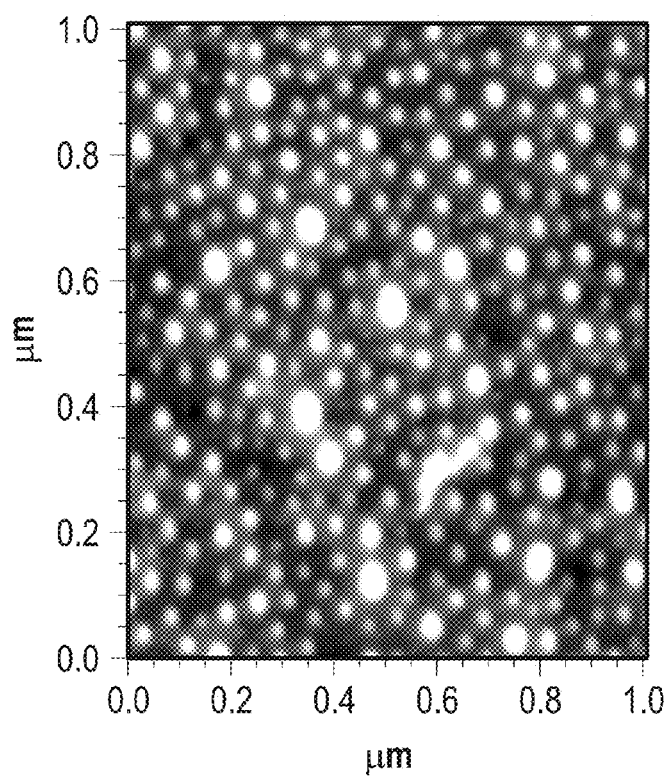
FIG. 12A show photomicrographs of tapping mode AFM (left) images of PS$_{58k}$-b-P4VP$_{18k}$:SM$_{Sb}$ films before spike-rapid thermal annealing (RTA); the quasi hexagonal morphology is evident in the image with identical dimensions of the discrete Sb-rich spherical domains.
FIG. 12B shows TEM (right) images of PS$_{58k}$-b-P4VP$_{18k}$:SM$_{Sb}$ films before spike-rapid thermal annealing (RTA); the quasi hexagonal morphology is evident in both images (FIGS. 12A and 12B) with identical dimensions of the discrete Sb-rich spherical domains.
Figure 12:
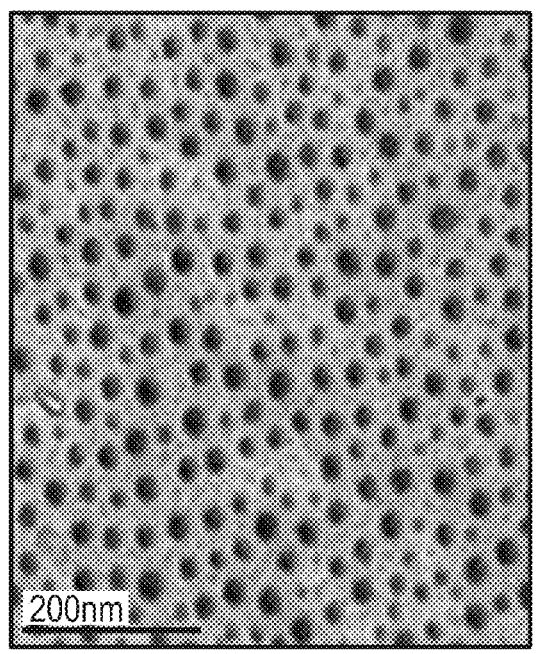

FIG. 12 show photomicrographs that compare tapping mode AFM (left) and TEM (right) images of PS$_{58k}$-b-P4VP$_{18k}$:SM$_{Sb}$ films before spike-RTA; the quasi hexagonal morphology is evident in both images with identical dimensions of the discrete Sb-rich spherical domains.

Combining the SIM depth profiling, AFM imaging, 4 pt probe analysis, and the TEM image analysis (Sb only) of the PS-b-P4VP:SM$_B$ and PS$_{27k}$-b-P4VP$_{7k}$:SM$_{Sb}$ doping systems, there is ample evidence to show that B and Sb doping in silicon under these RTA conditions not only confine B and Sb to depths below 10 nm, but also that B and Sb are laterally confined to discrete nanometer sized regions in two dimensions. To our knowledge, this is the first demonstration of 3D nanometer—confined dopant regions produced using RTA doping process. This is an important step towards defining specific doping region for various electronic devices.

As can be seen from the data in the FIGS. 11 and 12, the size and periodicity of the dopant in the substrate increases with the molecular weight of the block copolymer. The dopant concentration ranges from $10^{18}$ to $10^{21}$ atoms per square centimeter.

The doping described herein can be used to generate 2-dimensional doped substrates or 3-dimensional substrates. For example, it can be applied to textured substrates and to 3-dimensional substrates having projections.

What is claimed is:

1. A method for doping a substrate, comprising:
disposing a coating of a composition comprising a block copolymer, a dopant precursor and a solvent on a substrate; where the block copolymer is capable of phase segregating and embedding the dopant precursor while in solution or on a surface of the substrate; and annealing the substrate at a temperature of 550 to 1300° C. for 0.1 second to 24 hours to diffuse the dopant into the substrate.

2. The method of claim 1 wherein the dopant is chosen from boron, phosphorus, arsenic, antimony, aluminum, indium, and gallium.

3. The method of claim 1 wherein the substrate is a semiconducting substrate.

4. The method of claim 3 wherein the substrate comprises one or more of silicon, germanium, gallium arsenide, indium arsenide, indium phosphide, and indium gallium arsenide.

5. The method of claim 1 wherein a single annealing step is performed.

6. The method of claim 1 wherein the dopant is diffused into the substrate to a depth of ≤10 nm.

7. The method of claim 1 wherein the block copolymer comprises at least one block that undergoes hydrogen bonding or ionic bonding with the dopant precursor.

8. The method of claim 1 wherein the block copolymer is polystyrene-b-poly(4-vinylpyridine).

9. The method of claim 1 wherein the dopant precursor is 4-hydroxyphenyl boronic acid pinacol ester, fluoroantimonic acid hexahydrate, or a combination comprising at least one of the foregoing dopant precursors.

* * * * *